United States Patent [19]
Heid

[11] Patent Number: 6,034,528
[45] Date of Patent: Mar. 7, 2000

[54] METHOD FOR OPERATING A NUCLEAR MAGNETIC RESONANCE TOMOGRAPHY APPARATUS

[75] Inventor: Oliver Heid, Bern, Switzerland

[73] Assignee: Siemens Aktiengesellschaft, Munich, Germany

[21] Appl. No.: 08/718,411

[22] PCT Filed: Mar. 28, 1995

[86] PCT No.: PCT/DE95/00418

§ 371 Date: Sep. 30, 1996

§ 102(e) Date: Sep. 30, 1996

[87] PCT Pub. No.: WO95/27218

PCT Pub. Date: Oct. 12, 1995

[30] Foreign Application Priority Data

Mar. 31, 1994 [DE] Germany ............................ 44 11 362
Aug. 4, 1994 [DE] Germany ............................ 44 27 685

[51] Int. Cl.$^7$ ...................................................... G01V 3/00
[52] U.S. Cl. ............................................ 324/309; 324/307
[58] Field of Search ................................. 324/309, 307, 324/314, 312, 306, 300

[56] References Cited

U.S. PATENT DOCUMENTS

| | | | |
|---|---|---|---|
| 4,818,940 | 4/1989 | Hennig et al. | 324/309 |
| 5,125,407 | 6/1992 | Harms et al. | 128/653.2 |
| 5,126,673 | 6/1992 | Hennig | 324/309 |
| 5,212,448 | 5/1993 | LeRoux et al. | 324/309 |
| 5,229,717 | 7/1993 | Hinks | 324/307 |
| 5,432,448 | 7/1995 | Heid | 324/309 |
| 5,545,990 | 8/1996 | Keifer et al. | 324/307 |
| 5,952,827 | 9/1999 | Feinberg | 324/309 |

FOREIGN PATENT DOCUMENTS

| | | |
|---|---|---|
| 0 076 054 | 6/1983 | European Pat. Off. . |
| WO 90/00743 | 1/1990 | WIPO . |
| WO 93/01509 | 1/1993 | WIPO . |
| WO 93/02618 | 2/1993 | WIPO . |

OTHER PUBLICATIONS

"Burst Imaging," Hennig et al., MAGMA, vol. 1, No. 1, Mar. 1993, pp. 39–48.

"Quest—A Quick Echo Split NMR Imaging Technique," Heid et al., Magnetic Resonance in Medicine, vol. 29, No. 2, Feb. 1, 1993, pp. 280–283.

"Ultra–Rapid Gradient Echo Imaging," Magnetic Resonance in Medicine, vol. 33, No. 1, Jan. 1, 1995, pp. 143–149.

"Quest—A Quick Echo Split Imaging Technique," Heid et al., Book of Abstracts, p. 433, Annual Meeting of the Society of Magnetic Resonance in Medicine, 1992.

"Elimination of Transverse Coherences in FLASH MRI," Crawley et al., Magnetic Resonance in Medicine, vol. 8, (1988), pp. 248–260.

"Dante Ultrafast Imaging Sequence (DUFIS)," J. Mag. Res., Series B 101 (1993), pp. 106–109.

"parameter Relations for the Shinnar–Le Roux Selective Excitation Pulse Design Algorithm," Pauly et al., IEEE Trans. on Med. Imaging, vol. 10, No. 1, Mar. 1991, pp. 53–65.

*Primary Examiner*—Louis Arana
*Attorney, Agent, or Firm*—Hill & Simpson

[57] ABSTRACT

In a method in the form of a pulse sequence for operating a nuclear magnetic resonance tomography apparatus, a sequence of hard radio-frequency pulses is emitted in a first phase while simultaneously activating a gradient in a first direction, and the gradient in the first direction is inverted in a third phase and nuclear magnetic resonance signals arising in a sequence of sampling intervals are sampled in the presence of the inverted gradient, and these phases are repeated n times. The radio-frequency pulses are also emitted during the third phase between the sampling intervals, and the nuclear magnetic resonance signals are also sampled in the first phase during sampling intervals.

21 Claims, 7 Drawing Sheets

METHOD FOR OPERATING A NUCLEAR MAGNETIC RESONANCE TOMOGRAPHY APPARATUS

BACKGROUND OF THE INVENTION

1. Field of the Invention

The present invention is directed to a method in the form of a pulse sequence for operating a nuclear magnetic resonance tomography apparatus.

2. Description of the Prior Art

A pulse sequence is known from *Journal of Magnetic Resonance*, Series B 101 (1993), February, No. 1, pp. 106–109 wherein, during a first phase, a sequence of hard radio-frequency pulses is emitted and a gradient in a first direction is simultaneously activated and, during a third phase, the gradient in the first direction is inverted and the nuclear magnetic resonance signals arising in a sequence of sampling intervals are sampled under the influence of the inverse gradient. The first and third phases are repeated n times in order to obtain a complete image.

Short image exposure times are thereby of special significance. This is true not only in view of an optimally high patient throughput but, for example, in order to avoid motion artifacts. Short image exposure times are unavoidable for certain exposure techniques, for example cine mode (registering moving images).

Fast pulse sequences have special significance, for example, for determining the spread of contrast agents, for observing heart motion, for the brain function and for the kinematics of joints since a plurality of images must be registered in fast succession.

Of the methods that have been hitherto disclosed, the shortest image exposure times (40 through 100 ms) can be achieved with the EPI method. The EPI method is disclosed, for example, by European Letters Patent 0 076 054.

At the beginning of the pulse sequence, an RF excitation pulse is thereby beamed onto an examination subject under the influence of a slice selection gradient in a first direction. Nuclear spins are thereby excited in a slice of the examination subject. After the excitation, a phase-encoding gradient is activated in a second direction and a readout gradient is activated in a third direction. First, second and third direction reside perpendicular to one another. The readout gradient is composed of a pre-phasing pulse as well as of sub-pulses of alternating polarity. Due to this alternating polarity of the readout gradient, the nuclear spins are dephased and rephased in alternation. After a single excitation, so many signals are thereby acquired that the entire k-space is scanned, i.e. that the existing information suffice for the reconstruction of a complete tomogram.

The phase-encoding gradient is briefly activated with every change in the polarity of the readout gradient. The phase position of the nuclear spins is thus advanced by one step each time. The arising nuclear magnetic resonance signals are sampled in the time domain, digitized, and the numerical values acquired in this way are entered into a raw data matrix. An image of the examination subject is then reconstructed from this raw data matrix on the basis of a two-dimensional Fourier transformation. The speed advantage of the EPI method is essentially based thereon that a plurality of signals are acquired after a single excitation, these signals sufficing for the reconstruction of a complete tomogram. All signals that ultimately represent gradient echoes must be acquired within the $T2^*$ decay. The readout gradient must therefore be very rapidly bipolarly switched, so that considerably technological demands are made of the system.

Further, gradient echoes as generated in the EPI method have the disadvantage compared to spin echoes that they are sensitive to local field inhomogeneities.

U.S. Pat. No. 4,818,940 discloses a pulse sequence wherein a plurality of spin echoes are acquired due to a plurality of successive 180° radiofrequency pulses after a 90° radiofrequency pulse. The exposure times in this method, however, are longer than in the EPI method and the permitted radiofrequency stress on the patient is soon reached given fast repetition.

U.S. Pat. No. 5,126,673 discloses a pulse sequence wherein a sequence of many equidistant radiofrequency pulses, what is referred to as a pulse burst, is beamed in for the excitation of a specimen. The radiofrequency pulses comprise an extremely small flip angle on the order of magnitude of 0.1° through 2°. A train of equidistant echo signals with optimally constant amplitude is obtained following the sequence of the radiofrequency pulse. Amplitude and phase of the radiofrequency pulses are influenced in order to keep the amplitude of the echo signals optimally constant. A selective excitation or, refocussing as well as readout and phase-encoding gradients are provided for the imaging.

The possibility of omitting a more or less large plurality of radiofrequency pulses from the sequence of radiofrequency pulses is also mentioned. The disclosed, non-equidistant radiofrequency pulse sequence has the disadvantage that the amplitude constancy of the echo signals is difficult to optimize. Further, a plurality of echoes respectively coincide in the readout phase, so that a clean evaluation for image acquisition is practically impossible. Moreover, the signal-to-noise ratio becomes very unfavorable due to the small flip angles in the excitation.

U.S. Pat. No. 5,212,448 discloses a pulse sequence wherein a series of excitation radiofrequency pulses is respectively beamed in under slice-selection gradients. The excited spins are refocussed in chronological succession by subsequent application of a radiofrequency inversion pulse.

The article "QUEST—A Quick Echo Split Imaging Technique" in Book of Abstract, page 433, Annual Meeting of the Society of Magnetic Resonance and Medicine, 1992, likewise discloses a pulse sequence wherein a sequence of temporally non-equidistant excitation pulses and a first gradient are activated during an excitation phase. The existing spin magnetization is split into sub-collectives due to each excitation pulse following the first excitation pulse. During the readout phase, a temporally graduated refocussing of the individual sub-collectives ensues under a further gradient. A plurality of nuclear magnetic resonance signals can thereby be acquired after a single excitation phase, so that a short image exposure time is possible. The demands made of the gradient electronics remain low. This method, however, has the disadvantage that the acquired signals are difficult to interpret due to the increasing splitting into sub-collectives.

SUMMARY OF THE INVENTION

An object of the invention is to fashion a pulse sequence such that a short exposure time is achieved given low hardware demands.

The above object is achieved in accordance with the principles of the present invention in a method for operating a magnetic resonance tomography apparatus of the type described initially above, wherein radio-frequency pulses are also emitted during the third phase between the sampling intervals, and wherein nuclear magnetic resonance signals are also sampled in the first phase during sampling intervals.

Figure 1:
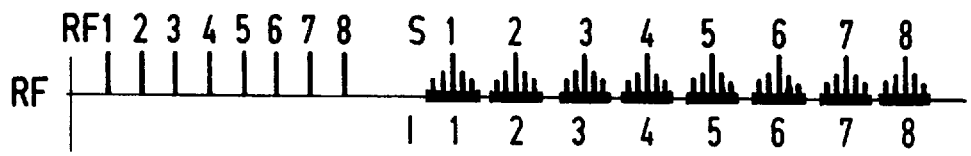
FIGS. 1–5 show a first exemplary embodiment of the inventive method, with excitation of the nuclear spins occurring only in the first phase.
Figure 2:
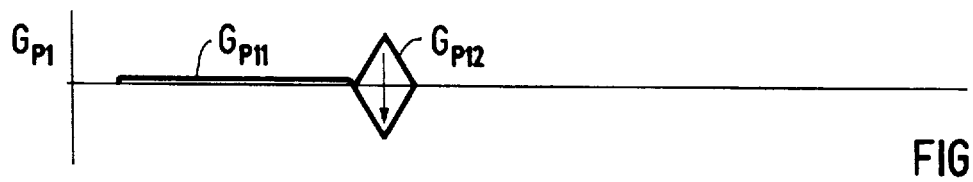
Figure 3:
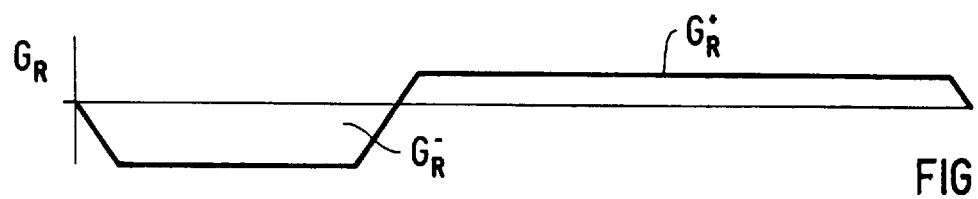
Figure 4:
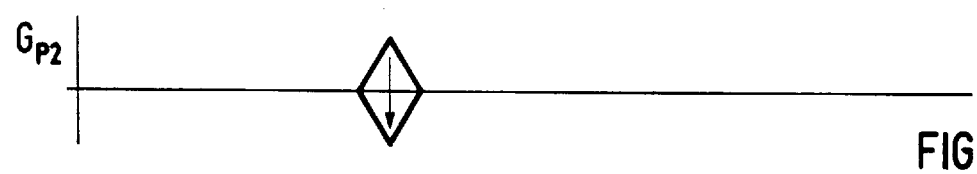

In conformity with a first exemplary embodiment of the invention according to FIGS. 1 through 5, a sequence—as shown in FIG. 1—of what are referred to as "hard" radiofrequency pulses, eight radiofrequency pulses RF1 through RF8, is first beam onto an examination subject. What are meant by "hard" radiofrequency pulses are those with a broadband frequency spectrum that also do not become slice-selective under the influence of gradients. Teachings for the design of radiofrequency pulses for the excitation of nuclear spins are provided, for example, in the article "Parameters Relations for the Shinnar-Le Roux Selective Excitation Pulse Design Algorithm" in IEEE Transactions on Medical Imaging, Vol. 10, No. 1, March 1991. The radiofrequency pulses RF1 through RF8 comprise a small flip angle of clearly less than 90°, for example 6°.

During the activation of the radiofrequency pulses (referred to as phase I), a gradient $G_{P11}$ in a first phase-encoding direction $G_{P1}$ and a negative gradient $G_R^-$ in readout direction are activated. As already mentioned, however, the radiofrequency pulses RF1 through RF8 remain non-selective.

Figure 5:
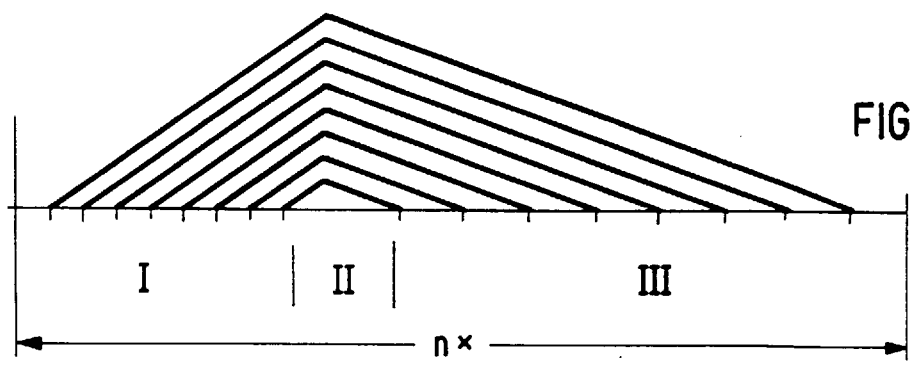

FIG. 5 shows the phase position of the excited nuclear spins with reference to the readout direction. The nuclear spins increasingly dephase in phase I under the influence of the gradient $G_R^-$.

In a phase II, a gradient GP12 in the first phase-encoding direction and a gradient $G_{P2}$ in the second phase-encoding direction are activated. Further, the direction of the gradient is switched in the readout direction $G_R$. During phase III, the nuclear spins successively rephase under the influence of the gradient $G_R^+$. The arising nuclear magnetic resonance signals S1 through S8 are sampled in the readout intervals I1 through I8 at the points in time of the rephasing. A view of FIG. 5 shows that the first nuclear magnetic resonance signal S1 thereby arises by refocussing of the excitation with the last radiofrequency pulse RF8; the last nuclear magnetic resonance signal S8 arises by refocussing of the nuclear spins excited with the first radiofrequency pulse RF1.

The nuclear magnetic resonance signals S1 through S8 are frequency coded by the gradient $G_R^+$ in the direction thereof. Further, they are phase-encoded in the first and second phase-encoding direction $G_{P1}$ and $G_{P2}$. They are differently phase-encoded in the first phase-encoding direction $G_{P1}$ by the gradient $G_{P11}$ since the effective duration of this gradient differs from nuclear magnetic resonance signal to nuclear magnetic resonance signal. An additional phase that is the same for all nuclear magnetic resonance signals S1 through S8 is impressed on the nuclear magnetic resonance signals S1–S8 by the phase-encoding gradient $G_{P12}$.

The illustrated sequence is implemented n times. The entire three-dimensional k-space is thereby scanned by stepping the gradient $G_{P12}$.

An extremely fast data acquisition is thereby possible. Since the gradient fields are switched significantly more seldom than the excitations (for example, one switching of the gradient GR in readout direction after eight excitations) and no high change rates are required, no particular demands are made of the gradient amplifier.

The longitudinal magnetization is constantly replenished by $T_1$ relaxations, so that a steady state condition of the magnetization arises. The measurement can thereby be fundamentally repeated arbitrarily often, whereby each measurement proceeds from the same longitudinal magnetization. Extremely short echo times (times between excitation and readout of the signal) are possible by section-by-section acquisition of the dataset needed for the image generation, so that the signal intensity and the image quality are hardly influenced by T2* decay, field inhomogeneities, diffusion and flux artifacts. Further, the variation of the echo time can be kept within the coherence time of the chemical shift and artifacts with respect thereto can be largely avoided. In the illustrated exemplary embodiment with eight echoes per sub-sequence and 64 k-space rows according to FIGS. 1 through 5, for example, echo times in the range between 2.277 ms and 18.517 ms can be achieved, as a result which an effective k-space scanning bandwidth of 61.6 Hz per pixel is achieved in the phase-encoding direction. The chemical shift between fat and water of 140 Hz given a field strength of 1 T thus only causes an image distortion of about 2.5 pixels.

FIGS. 6 through 9 show a further exemplary embodiment of the invention. Differing from the first exemplary embodiment, further radiofrequency signals RF9 through RF16 are thereby beamed in in phase III in the pauses between the readout intervals I1 through I8. Further, nuclear magnetic resonance signals are likewise read out in the interval I during the readout intervals I9 through I16. This, of course, is only possible when the illustrated sub-sequence is preceded by an identical sub-sequence. The nuclear magnetic resonance signals in the readout intervals I9 through I16 in the illustrated sub-sequence then arise due to rephasing of the nuclear spins excited by the radiofrequency pulses RF9 through RF16 of the preceding sub-sequence. Twice the number of nuclear magnetic resonance signals can be acquired with this type of excitation without lengthening the measuring time. The fast switching of the radiofrequency transmission and reception system required here is significantly less problematical than gradient switchings in EPI measurements.

Figure 7:
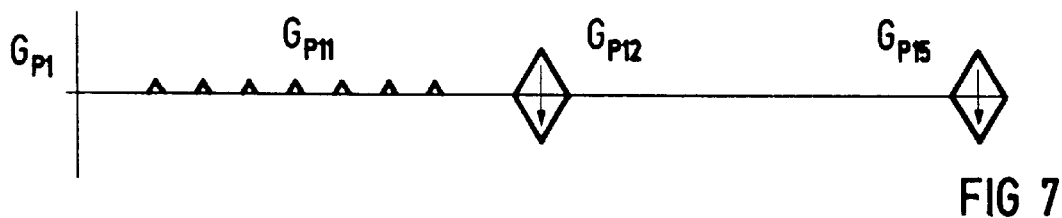
Figure 8:
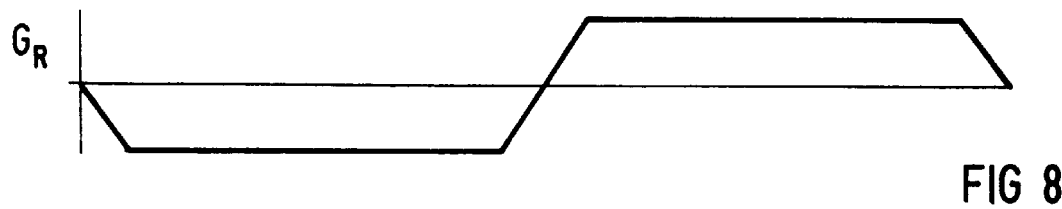
Figure 9:
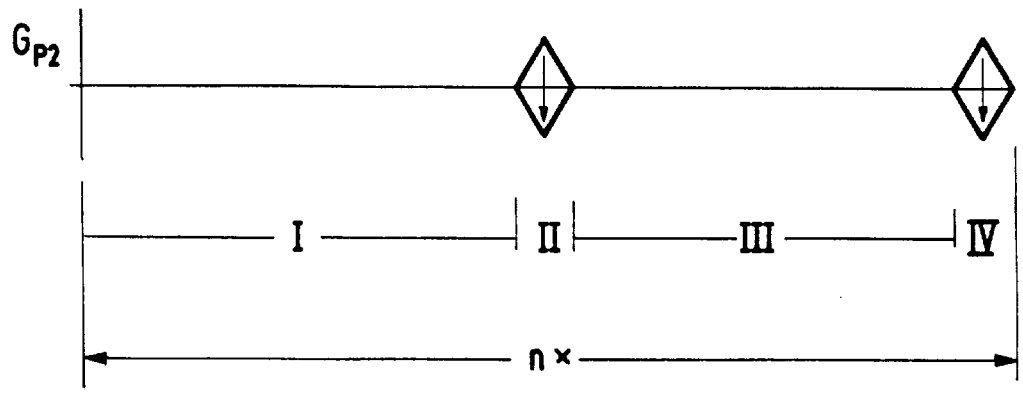
Figure 10:
FIGS. 10–14 illustrate a further exemplary embodiment of the inventive method.
Figure 11:
Figure 12:
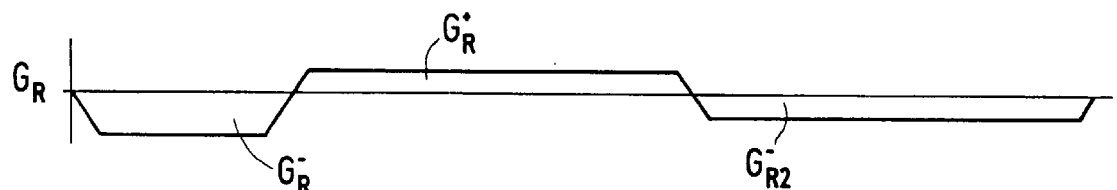
Figure 13:

In the second exemplary embodiment, the phase-encoding in phase I, as may be seen in FIG. 7, does not ensue with a through-connected phase-encoding gradient in the first phase-encoding direction $G_{P1}$ but with individual pulses $G_{P11}$. The phase-encoding in the k-space is thus stepped step-by-step from row to row, i.e. an oblique scanning of the k-space does not ensue as in the exemplary embodiment according to FIG. 2.

In the second exemplary embodiment, too, it suffices when a phase-encoding gradient in the first phase-encoding direction $G_{P1}$ is activated in one of the phases I or III, since this both influences the nuclear magnetic resonance signals sampled in phase I and also phase-encoding the nuclear spins that are excited in phase I. Differing from FIG. 2, a phase-encoding gradient $G_{P2}$ that uniformly steps the phase for the entire preceding pulse train is also only provided in a phase IV after the phase III given the phase-encoding according to FIGS. 7 and 9.

Figure 14:
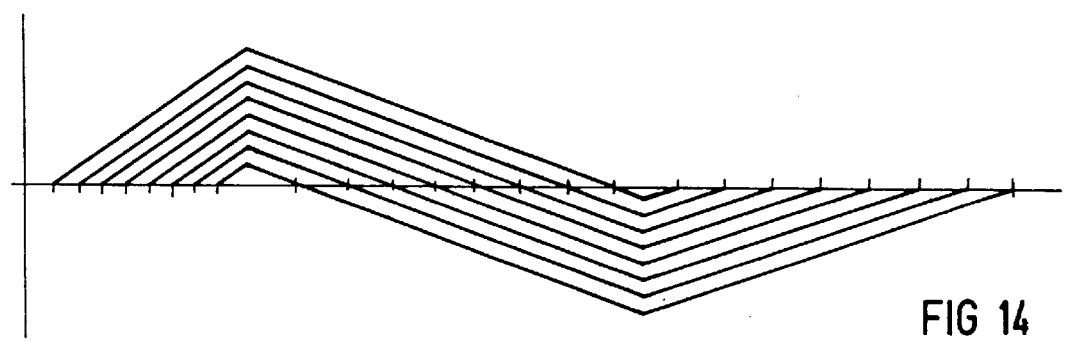

A further exemplary embodiment of the invention is shown in FIGS. 10 through 14. According to FIG. 12, the gradient $G_R$ in readout direction is thereby inverted not only once but twice ($G_{R2}^-$). As shown in FIG. 14, the spins dephased under the influence of the gradient $G_R^+$ are thus in turn rephased, so that a further group of nuclear magnetic resonance signals S9 through S16 arises. By further inversions of the gradient $G_R$ in readout direction, of course, even more nuclear magnetic resonance signals can thereby be generated. In the illustrated exemplary embodiment, the phase-encoding in the first phase-encoding direction ensues by short phase-encoding pulses $G_{P11}$, before every nuclear magnetic resonance signal S. The phase-encoding in the k-space is thus stepped step-by-step from row to row.

A second phase-encoding gradient $G_{P2}$ in the second phase-encoding direction is activated before the readout phase. This uniformly codes the nuclear magnetic resonance signals S1 through S16 of the following readout phase in the second phase-encoding direction.

Even more nuclear magnetic resonance signals than in the preceding exemplary embodiments can be acquired per excitation with the exemplary embodiment according to FIGS. 10 through 14.

In principle, the nuclear spins excited in a sub-sequence are rephased not only in the next sub-sequence but are also multiply rephased in the succeeding sub-sequences, even though the nuclear magnetic resonance signals thereby arising have a greatly decreasing amplitude due to the T2* decay. However, disturbing coherencies can occur due to these additional signals. In order to avoid this, the phases of the whole pulse trains can be turned in successive phases I, III of the sub-sequences. Correspondingly, the reference phase must then also be turned in the demodulation of the respectively allocated echoes. Disturbing coherence artifacts are avoided with this method, which is also referred to as radiofrequency spoiling. The creation and avoidance of coherence artifacts are described in greater detail in the article "Elimination of Transverse Coherences in LASH-MRI" in Magnetic Resonance in Medicine, 8, pp. 248–260, (1988).

The echo times vary in the described method of echo generating. It becomes clear when viewing FIG. 5 that, for example, the echo time between the first radiofrequency pulse RF1 and the allocated echo S8 is clearly longer than between the radiofrequency pulse RF8 and the allocated echo S1. With a longer echo time, however, the echo amplitude decreases. The different amplitudes are undesirable and can be largely avoided in that the earlier radiofrequency pulses comprise a higher flip angle than the later ones, i.e. that the flip angle decreases from radiofrequency pulse RF1 to radiofrequency pulse RF8.

Figure 15:
FIGS. 15 and 16 illustrate an exemplary embodiment of the inventive method with pre-saturation.
Figure 16:
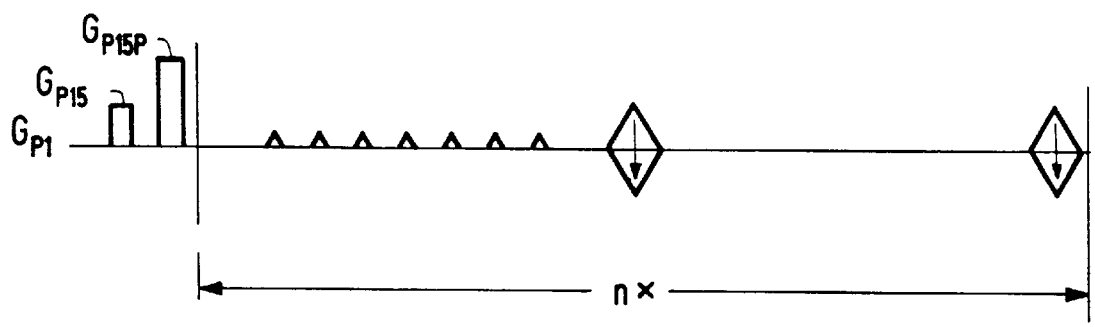

The pulse sequences according to the inventive method are fundamentally not slice-selective, so that a three-dimensional volume is normally excited and read out. In some instances, however, specific slices should be selected or, respectively, neighboring slices should be blanked out. A blanking of slices or, regions can be achieved in that, corresponding to the pulse sequence according to FIGS. 15 and 16, a region or a slice is selectively saturated. To that end, for example, the actual pulse sequence can be preceded by a frequency-selective radiofrequency pulse $RF_S$ that is beamed in under the influence of a slice-selection gradient $G_{P1S}$. Subsequently, a spoiler gradient $G_{P1Sp}$ is activated that dephases the magnetization generated by the excitation. A slice whose position and thickness is determined by the frequency width and band width of the radiofrequency pulse $RF_S$ and the amplitude of the gradient $G_{P1S}$ is thus saturated. Since the nuclear spins are depolarized in this saturated slice, no nuclear magnetic resonance signals can be excited in this slice in the following pulse sequence.

Figure 17:
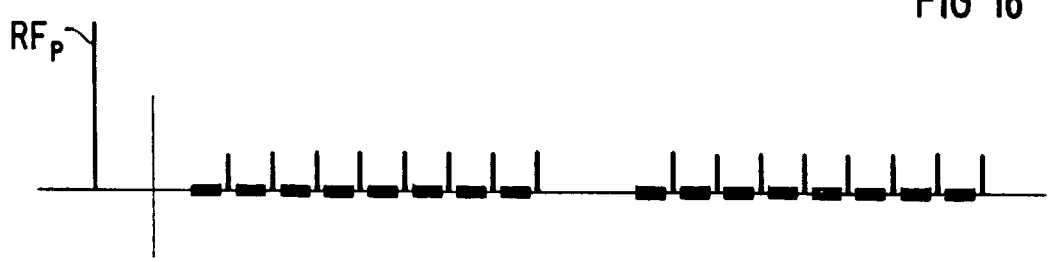
FIG. 17 illustrates an exemplary embodiment of the inventive method with a preparation pulse.

The image contrast behavior can be influenced in that the longitudinal magnetization is prepared before the actual measuring sequence. To that end, for example according to FIG. 17, a radiofrequency preparation pulse RFp in the form of a 180° can be beamed in before the first sub-sequence.

Figure 18:
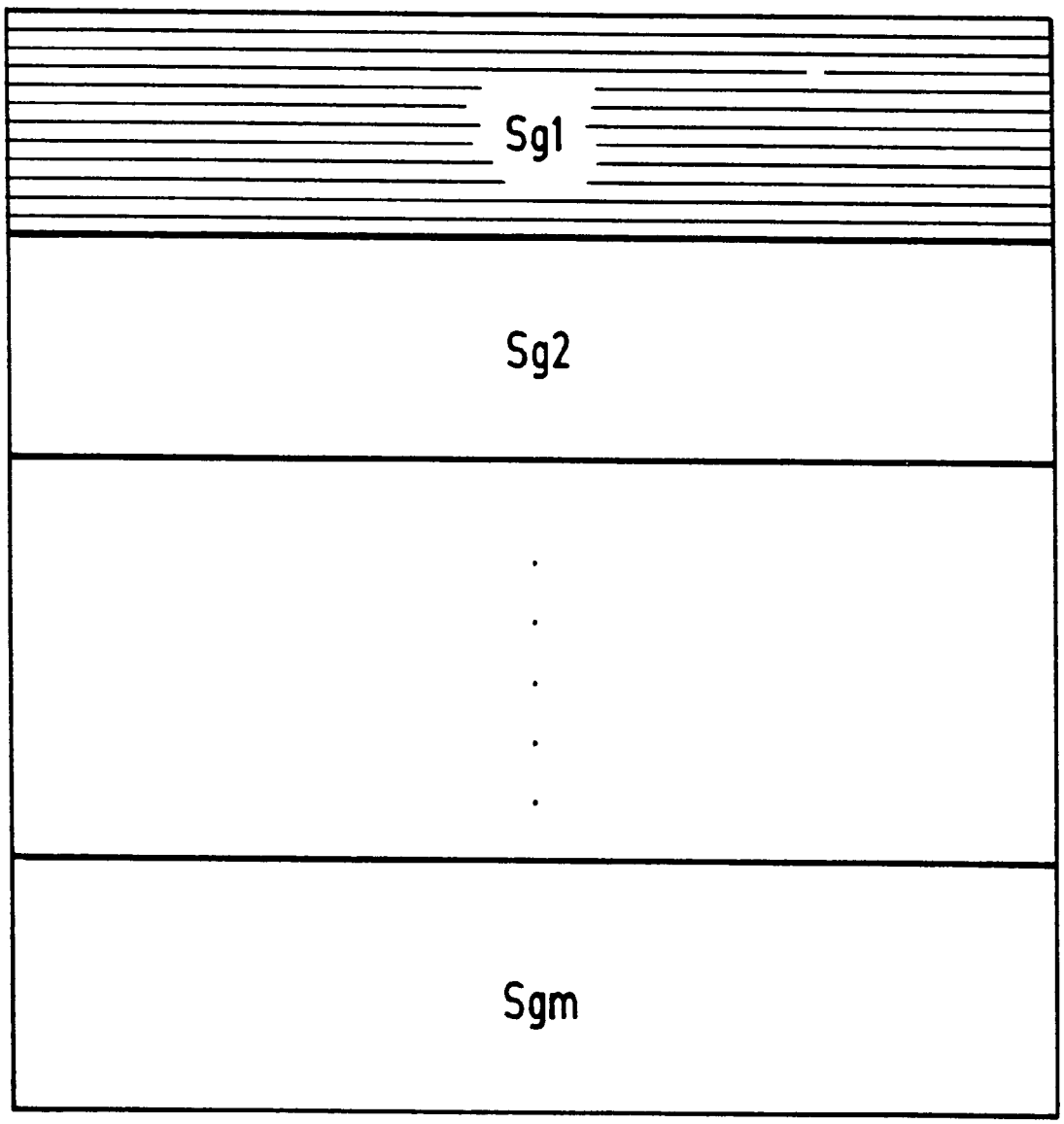
FIG. 18 illustrates the segmenting of the k-space used in combination with the inventive method.
Figure 19:
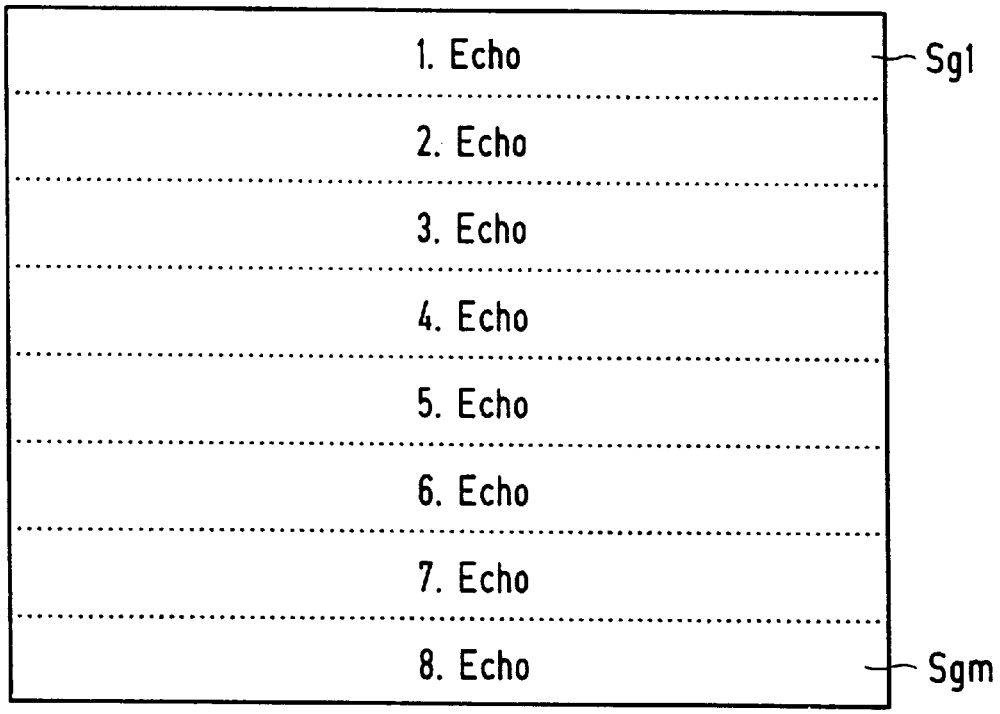
FIGS. 19 and 20 illustrate the ordering of the nuclear magnetic resonance signals in the k-space in the case of partial image acquisition.

In a sub-sequence of the disclosed method, all raw data required for a complete three-dimensional image cannot typically be acquired or, expressed in other terms: the complete k-space cannot be scanned. Advantageously, the k-space is therefore segmented is the way shown two-dimensionally in FIGS. 18 and 19, i.e. is divided into individual segments Sg1 through Sgm to which an interconnected block of rows is respectively allocated. The plurality of segments Sg thereby corresponds to the plurality of nuclear magnetic resonance signals acquired per sub-sequence, i.e. eight segments in the case of the pulse sequence of FIG. 1; sixteen segments are present in the case of the pulse sequence of FIG. 6. Successive rows in each segment Sg are then filled by successive sub-sequences, whereby the sub-sequences are implemented until all rows of the raw data matrix are filled.

The allocation of a nuclear magnetic resonance signal to a row of a raw data matrix is determined by the phase factor thereof. The sequence of the sorting can thus be arbitrarily prescribed by a corresponding setting of the phase factors. As already mentioned, the nuclear magnetic resonance signals within a sub-sequence comprise different amplitudes. Greater differences in amplitude from row to row of a raw data matrix are to be avoided insofar as possible since this leads to artifacts in the image. The sampled nuclear magnetic resonance signals are therefore ordered such in the raw data matrix R according to FIG. 19 that all first echoes of the individual sub-sequences are sorted into the first segment Sg1, all second echoes are sorted into the second segment Sg2, etc.

Figure 6:
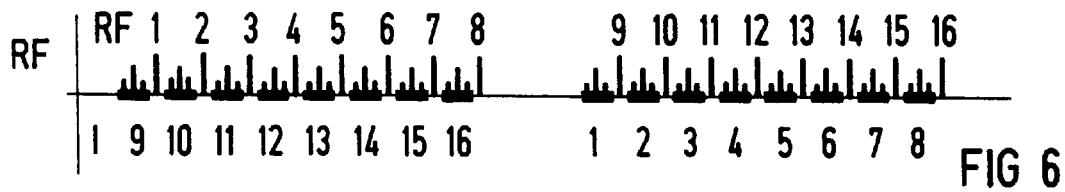
FIGS. 6–9 illustrate a second exemplary embodiment of the inventive method with excitation of the nuclear spins in the first and third phases.
Figure 20:
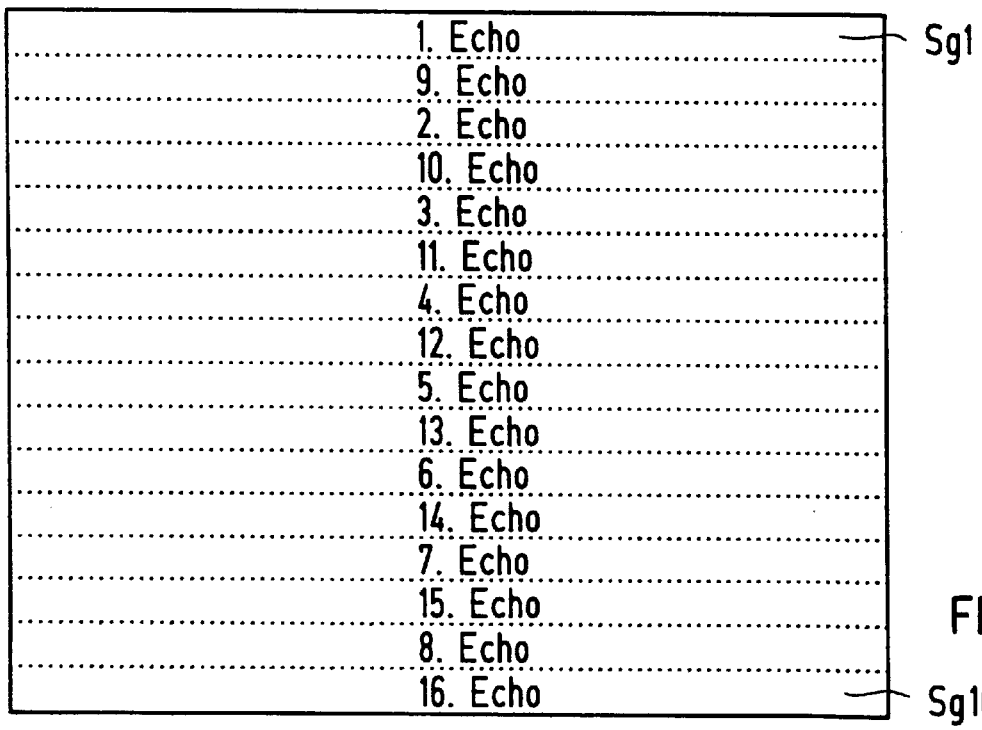

In the case of a pulse sequence according to FIG. 6, wherein, thus, nuclear magnetic resonance signals are acquired both in phase I as well as in phase II, the ordering ensues according to FIG. 20. The first echoes of all sub-sequences are thereby ordered into the first segment Sg1 and the ninth echoes of all sub-sequences are ordered into the second segment Sg2 since the first and ninth echoes comprise largely the same amplitude. Correspondingly, the second and the tenth echo, the third and the eleventh echo, etc., are successively ordered into the segments Sg1 through Sg16.

Figure 21:
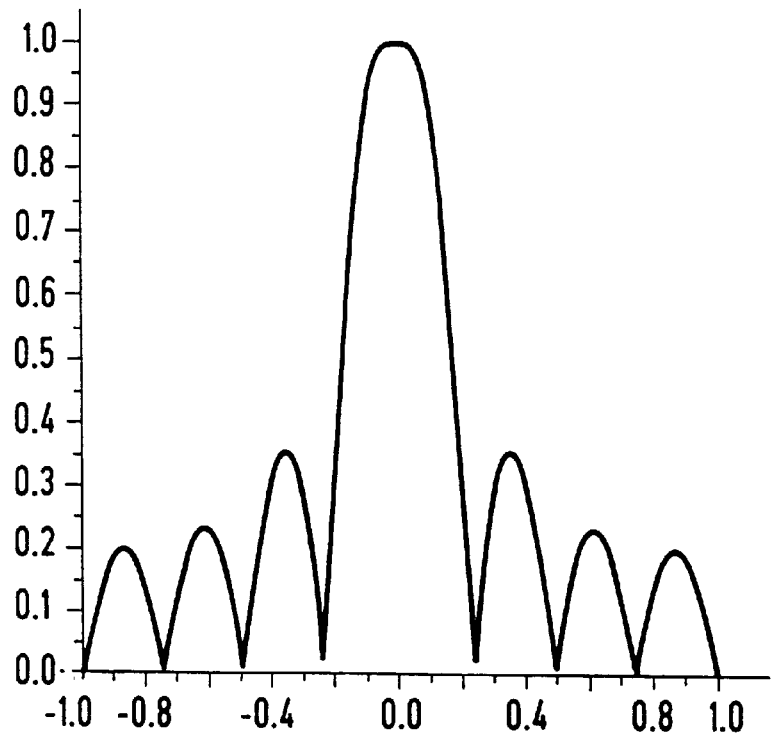
FIG. 21 illustrates the frequency spectrum of an excitation pulse sequence with a constant flip angle.

Even though the spectrum of an individual "hard" radiofrequency pulse is broadband, a comparatively narrow spectrum as shown in FIG. 21 nonetheless arises due to the influence of an entire pulse train because of the length thereof. This spectrum is composed of individual lines, whereby a signal can only be acquired from these spectral lines. However, there is a possibility of spreading the spectrum of the entire pulse train, namely by phase modulation of the individual pulses. A noticeable broadening can, for example, be achieved with the following phase sequence:

180°, 45°, (−45°), (−90°), (−90°), (−45°), 45°, 180°.

Figure 22:
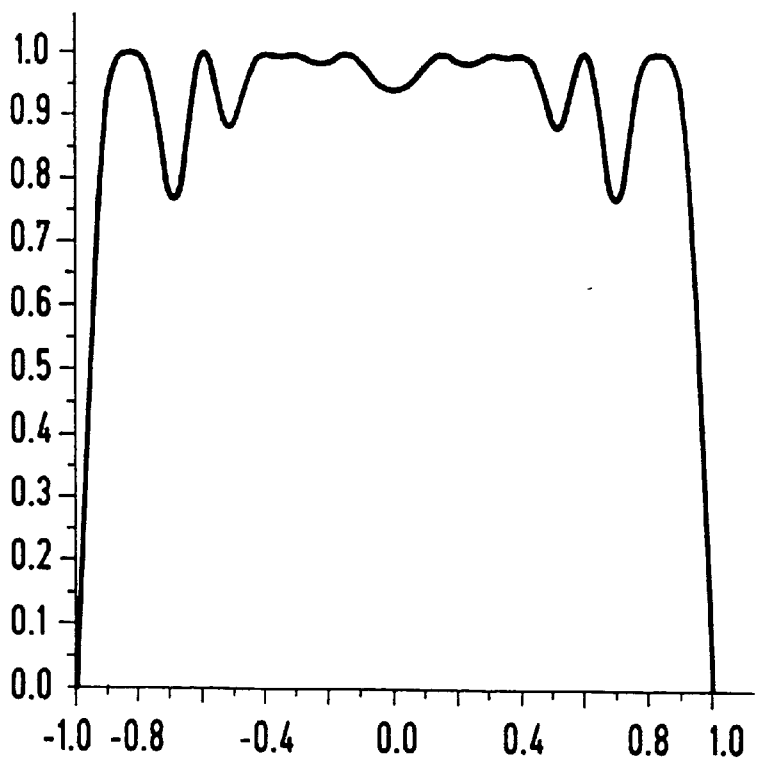
FIG. 22 illustrates the frequency spectrum of an excitation pulse sequence with an optimized flip angle distribution.

The excitation spectrum achieved with this pulse train is illustrated in FIG. 22.

The phase modulation of radiofrequency pulses in a pulse train is also discussed in the article "Burst Excitation Pulses" in 10$^{th}$ SMRM Book of Abstracts, page 269, 1991.

The particular advantage of the illustrated method is comprised in the low plurality of switching of the readout gradients relative to the plurality of signals that are read out. In all illustrated embodiments, the readout gradient comprises only four ramps per sub-measurement. Due to the inductance of the gradient coils, steep pulse ramps cause a high switching voltage and, thus, corresponding demands made of the gradient amplifier and the electric strength of the gradient coils. Given traditional fast sequences and a traditional gradient amplifier/gradient coil system, the ramp time that is normally not available for the excitation and the readout of nuclear magnetic resonance signals already enters greatly into the overall time of a pulse sequence. Since the plurality of signals is clearly greater than the plurality of ramps given the pulse sequence disclosed here, the ramp times are of less significance. This is considered in greater detail below.

A pulse sequence can be judged according to a quantity η that could be referred to as sampling efficiency:

$$\eta = \frac{\text{effective readout time}}{\text{total acquisition time}}$$

This quantity is limited by the time that is not available for the sampling of the nuclear magnetic resonance signals. The significance of the factor η can be recognized when the effective receiver bandwidth Δf that directly determines the signal-to-noise ratio is expressed dependent on the above-defined sampling efficiency η and the repetition time $T_R$ of the sequence:

$$\Delta f = \frac{1}{\eta \cdot T_R}$$

In practice, the sampling efficiency with shorter measuring times is not deteriorated because of the relatively constant ramp times that are not available for the sampling. In the two-dimensional EPI method, too, which presently represent the optimum with respect to measuring time and signal intensity, η for a sinusoidal readout only lies at below 0.637. Given the pulse sequence according to FIGS. 1 through 5, only radiofrequency pulses are beamed in during a half-wave of the readout gradient $G_R$ and only signals are read out during the other half-wave. When both gradient half-waves have identical amplitudes, the sampling efficiency remains below 0.5. When, however, the amplitude of the readout gradient $G_R^-$ is made higher in phase I than in phase III, phase I becomes shorter, so that the sampling efficiency can be raised above 0.5.

Given the pulse sequence according to FIGS. 6 through 9, by contrast, the sampling phase extends both onto phase I as well as onto phase III. This technique is thus significantly faster and more efficient but is technically more demanding. Normally, the switching time for the transmission-reception duplexer lies in the region of a few microseconds but a readout period lies at a few milliseconds, so that the goal of continuous sampling can be nearly reached.

An analysis of the dynamic $T_1$ relaxation and of the steady-state condition in the longitudinal direction given small flip angles of the radiofrequency pulses can be simplified without great errors in that these are viewed as being equidistantly spaced with an average repetition time $T_R$. Given a repetition time $T_R$ that is significantly shorter than the longitudinal relaxation time $T_1$ and with a receiver bandwidth Δf, the optimum signal-to-noise ratio per time unit for a three-dimensional scanning given M slices and Fourier reconstruction derives as:

$$\frac{S}{N \cdot \sqrt{T_R}} = \frac{\sqrt{\eta \cdot T_R \cdot M}}{2 T_1}$$

A sequence-independent scaling factor was omitted.

A similar consideration given the multi-layer two-dimensional EPI method with a fully relaxed initial magnetization yields:

$$\frac{S}{N \cdot \sqrt{T_R}} = \frac{1}{2} \sqrt{\eta}$$

For comparison purposes, $T_R$ here references the average echo spacing. The factor ½ was introduced in order to take the signal loss of about 50% that has been observed in practice into account. This is ascribed to the strong T2* decay and the fat saturation.

For comparison, a subject with a relaxation time $T_1$ of 500 ms shall be considered below. This is scanned with 64×64×128 k-space points both by a two-dimensional multi-slice spin echo EPI with a sampling efficiency of η=0.41 and with the method disclosed herein. Given an actually implemented pulse sequence according to FIGS. 1 through 5, a repetition time $T_R$ of 2.63 ms and a sampling efficiency of η=0.59 was achieved. With these parameters, the signal-to-noise ratio normalized with respect to the measuring time is roughly identical for the two techniques, i.e. 0.31 for the three-dimensional method disclosed herein and 0.32 for EPI. The 3D imaging method presented here and EPI consequently leads to images with a similar signal-to-noise ratio given identical measuring time.

The pulse sequence according to FIGS. 1 through 5 with 128 partitions was implemented on a conventional nuclear magnetic resonance tomography apparatus Siemens Magnetom Impact with a gradient field strength of 15 mT per meter and 15 T/m·s gradient change rate. Eight "hard" radiofrequency pulses with a flip angle of α=6° and a duration of respectively 10 μs were beamed in in a sub-sequence. The beamed-in radiofrequency power SAR (specific absorption rate) lay far below the limit values of the FDA (Food and Drug Administration). A sampling efficiency of η=0.59 was achieved. The digitization of 128×64×128 k-space points at 83 kHz required a total measuring time of 21.5 s or 168 ms per slice.

An isotropic, linear resolution up to 2 mm for a minimum observation window (field of view) of 260×260×260 mm³ was able to be achieved with this pulse sequence. Images from the human head with an observation field (field of view) of 280×280 mm and 2.15 mm effective individual slice thickness exhibited a signal-to-noise ratio S/N of about 30 to 40.

A pulse sequence according to FIGS. 6 through 9 was implemented on the same system. The flip angles amounted to α=5°. Given a sampling rate of 200 Khz, an imaging volume (volume of view) of 160×320×320 mm³ derived. A total of 1.35 s (83 ms per slice) were required for the measurement of 16×64×128 k-space points. The average echo repetition time lay at $T_R=1.31$ ms. Due to hardware limitations in the surface coil employed, the inherently possible sampling efficiency decreased from $\eta=0.76$ to $\eta=0.49$. Only weak artifacts due to chemical shift could be observed, so that neither a shimming nor fat suppression was necessary. A normed signal-to-noise ratio of about 25 given a slice thickness of 10 mm was able to be achieved with a circularly polarized radiofrequency coil. A series of up to 72 successive 3D pulse sequences (1152 images in 97 seconds) exhibited a constant image quality. It was thus shown that a steady-state condition is established in longitudinal direction during the measurement.

Although modifications and changes may be suggested by those skilled in the art, it is the intention of the inventor to embody within the patent warranted hereon all changes and modifications as reasonably and properly come within the scope of his contribution to the art.

I claim:

1. A method for image acquisition in a nuclear magnetic resonance tomography apparatus, comprising the steps of:

during a first phase, exciting nuclear spins in a subject by emitting a sequence of hard radio-frequency pulses and simultaneously activating a gradient in a first direction and sampling nuclear magnetic resonance signals arising from said nuclear spins, in a sequence of sampling intervals during said gradient;

following an intervening second phase, in a third phase inverting said gradient in the first direction to produce an inverted gradient, and sampling nuclear magnetic resonance signals, arising from said nuclear spins, in a sequence of sampling intervals during said inverted gradient and emitting further radio-frequency pulses between the sampling intervals; and repeating said first, second and third phases n times.

2. A method as claimed in claim 1 wherein the step of inverting the gradient in the first direction comprises multiply inverting the gradient in the first direction during said third phase.

3. A method as claimed in claim 1 comprising the additional step of activating, in said second phase, a phase-encoding gradient in a second direction perpendicular to said first direction, said phase-encoding gradient having an amplitude-time area which varies from repetition-to-repetition.

4. A method as claimed in claim 3 comprising the additional step of, in said second phase, activating a further phase-encoding gradient in a third direction perpendicular to said first and second directions, said further phase-encoding gradient having an amplitude-time area which varies from repetition-to-repetition.

5. A method as claimed in claim 1 comprising the additional step of activating, in said second phase and in a fourth phase following said third phase, a phase-encoding gradient in a second direction perpendicular to said first direction, said phase-encoding gradient having an amplitude-time area which varies from repetition-to-repetition.

6. A method as claimed in claim 5 comprising the additional step of, in said second phase and in said fourth phase, activating a further phase-encoding gradient in a third direction perpendicular to said first and second directions, said further phase-encoding gradient having an amplitude-time area which varies from repetition-to-repetition.

7. A method as claimed in claim 1 comprising the additional step of activating a phase-encoding gradient in a second direction perpendicular to said first direction in at least one of said first and third phases.

8. A method as claimed in claim 7 wherein the step of activating said phase-encoding gradient comprises activating a phase-encoding gradient in a second direction perpendicular to said first direction during an entirety of at least one of said first and third phases.

9. A method as claimed in claim 7 wherein the step of activating said phase-encoding gradient comprises activating a phase-encoding gradient composed of a plurality of individual pulses in a second direction perpendicular to said first direction between said sampling intervals.

10. A method as claimed in claim 1 wherein the step of inverting the gradient in the first direction comprises multiply inverting the gradient in the first direction during said third phase, and activating a phase-encoding gradient, in a second direction perpendicular to said first direction, composed of a plurality of individual pulses in at least one of said first and third phases, between said sampling intervals in the phase in which said phase-encoding gradient is activated.

11. A method as claimed in claim 1 wherein sampling said nuclear magnetic resonance signals in said sampling intervals in said first and third phases produces sampled nuclear magnetic resonance signals, and said method comprising the additional steps of:

writing said sampled nuclear magnetic resonance signals, dependent on phase-encoding in k-space of said nuclear spins, into respective rows of a raw data matrix having a plurality of rows;

dividing said raw data matrix into a plurality of segments, each segment comprising n interconnected rows, with the plurality of segments equaling a plurality of differently phase-encoded nuclear spins per repetition;

phase-encoding said nuclear spins in said third phase for allocating the sampled nuclear magnetic resonance signals to respective segments; and phase-encoding said nuclear spins in at least one of said phases for allocating said sampled nuclear magnetic resonance signals to respective individual rows of a segment.

12. A method as claimed in claim 11 further comprising a fourth phase, following said third phase, and comprising the additional steps of also phase-encoding said nuclear spins in said fourth phase for allocating the sampled nuclear magnetic resonance signals to respective segments, and phase-encoding said nuclear spins in at least one of said first, second, third and fourth phases, for allocating the sampled nuclear magnetic resonance signals to said respective individual rows of a segment.

13. A method as claimed in claim 11 comprising the additional step of ordering the rows of the raw data matrix by minimizing amplitude differences between the sampled nuclear magnetic resonance signals respectively written into neighboring rows of said raw data matrix.

14. A method as claimed in claim 11 wherein each sampled nuclear magnetic resonance signal has an echo time associated therewith, and comprising the additional step of continuously varying said echo times from k-space row to k-space row by varying a time interval between said radio-frequency pulses and said sampling intervals.

15. A method as claimed in claim 1 comprising the additional step of phase-modulating said radio-frequency pulses and said further radio-frequency pulses for broadening an excitation spectrum thereof.

16. A method as claimed in claim 1 wherein each of said radio-frequency pulses has an amplitude, and comprising the additional step of varying the respective amplitudes of said radio-frequency pulses from radio-frequency pulse to radio-frequency pulse.

17. A method as claimed in claim 1 wherein each of said further radio-frequency pulses has an amplitude, and comprising the additional step of varying the respective amplitudes of said further radio-frequency pulses from further radio-frequency pulse to further radio-frequency pulse.

18. A method as claimed in claim 1 wherein each of said radio-frequency pulses and each of said further radio-frequency pulses has an amplitude, and comprising the additional steps of varying the respective amplitudes of said radio-frequency pulses from radio-frequency pulse to radio-frequency pulse and varying the respective amplitudes of said further radio-frequency pulses from further radio-frequency pulse to further radio-frequency pulse.

19. A method as claimed in claim 1 wherein each radio-frequency pulse has a pulse phase associated therewith, and comprising the additional step of alternating said pulse phases in successive repetitions of said first phase.

20. A method as claimed in claim 1 comprising the additional steps of phase-encoding said nuclear spins; and resetting the phase-encoding of said nuclear spins after each of said first and third phases.

21. A method as claimed in claim 1 wherein said image has an image contrast and wherein said nuclear spins have a longitudinal magnetization, and comprising the additional step of modifying said image contrast by preparing said longitudinal magnetization before at least one repetition.

\* \* \* \* \*